United States Patent
Ranjan et al.

(10) Patent No.: US 11,055,173 B2
(45) Date of Patent: Jul. 6, 2021

(54) REDUNDANT STORAGE OF ERROR CORRECTION CODE (ECC) CHECKBITS FOR VALIDATING PROPER OPERATION OF A STATIC RANDOM ACCESS MEMORY (SRAM)

(71) Applicants: STMicroelectronics (Grenoble 2) SAS, Grenoble (FR); STMicroelectronics International N.V., Schiphol (NL); STMicroelectronics S.r.l., Agrate Brianza (IT)

(72) Inventors: Om Ranjan, New Delhi (IN); Riccardo Gemelli, Carugate (IT); Denis Dutey, Jarrie (FR)

(73) Assignees: STMicroelectronics (Grenoble 2) SAS, Grenoble (FR); STMicroelectronics International N.V., Schiphol (FR); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/703,672

(22) Filed: Dec. 4, 2019

(65) Prior Publication Data

US 2020/0110663 A1 Apr. 9, 2020

Related U.S. Application Data

(63) Continuation of application No. 15/810,731, filed on Nov. 13, 2017, now Pat. No. 10,528,422.

(51) Int. Cl.
*G06F 11/10* (2006.01)
*G06F 11/16* (2006.01)
(Continued)

(52) U.S. Cl.
CPC .......... *G06F 11/1068* (2013.01); *G06F 11/10* (2013.01); *G06F 11/16* (2013.01); *G06F 11/20* (2013.01); *G11C 29/52* (2013.01)

(58) Field of Classification Search
CPC .................................................. G06F 11/1068
(Continued)

(56) References Cited

U.S. PATENT DOCUMENTS 6,216,247 B1 4/2001 Creta et al.
7,194,577 B2 3/2007 Johnson et al.
(Continued)

FOREIGN PATENT DOCUMENTS

EP 2960777 A1 12/2015
WO 2010048711 A1 5/2010

OTHER PUBLICATIONS

EPO Search Report and Written Opinion for EP 18205453.6 dated Mar. 12, 2019 (9 pages).

*Primary Examiner* — Fritz Alphonse
(74) *Attorney, Agent, or Firm* — Crowe & Dunlevy

(57) ABSTRACT

Application data and error correction code (ECC) checkbits associated with that application data are stored in a first memory. The ECC checkbits, but not the application data, are stored in a second memory. In response to a request to read the application data from the first memory, the ECC checkbits from the first memory are also read and used to detect, and possibly correct, errors in the read application data. The ECC checkbits are further output from both the first and second memories for bit-by-bit comparison. In response to a failure of the bit-by-bit comparison, a signal indicating possible malfunction of one or the other or both of the first and second memories is generated.

21 Claims, 1 Drawing Sheet

(51) Int. Cl.
*G06F 11/20* (2006.01)
*G11C 29/52* (2006.01)

(58) Field of Classification Search
USPC .............................. 714/764, 762, 765, 767
See application file for complete search history.

(56) References Cited

U.S. PATENT DOCUMENTS

| | | |
|---|---|---|
| 7,620,875 B1 | 11/2009 | Nelson et al. |
| 2007/0168781 A1 | 7/2007 | Sutardja et al. |
| 2013/0191698 A1 | 7/2013 | Meaney et al. |
| 2015/0135031 A1 | 5/2015 | Cohen et al. |
| 2015/0199233 A1 | 7/2015 | Pelley et al. |
| 2016/0155515 A1 | 6/2016 | Son et al. |
| 2019/0102254 A1* | 4/2019 | Saxena ................. H03M 13/19 |

* cited by examiner

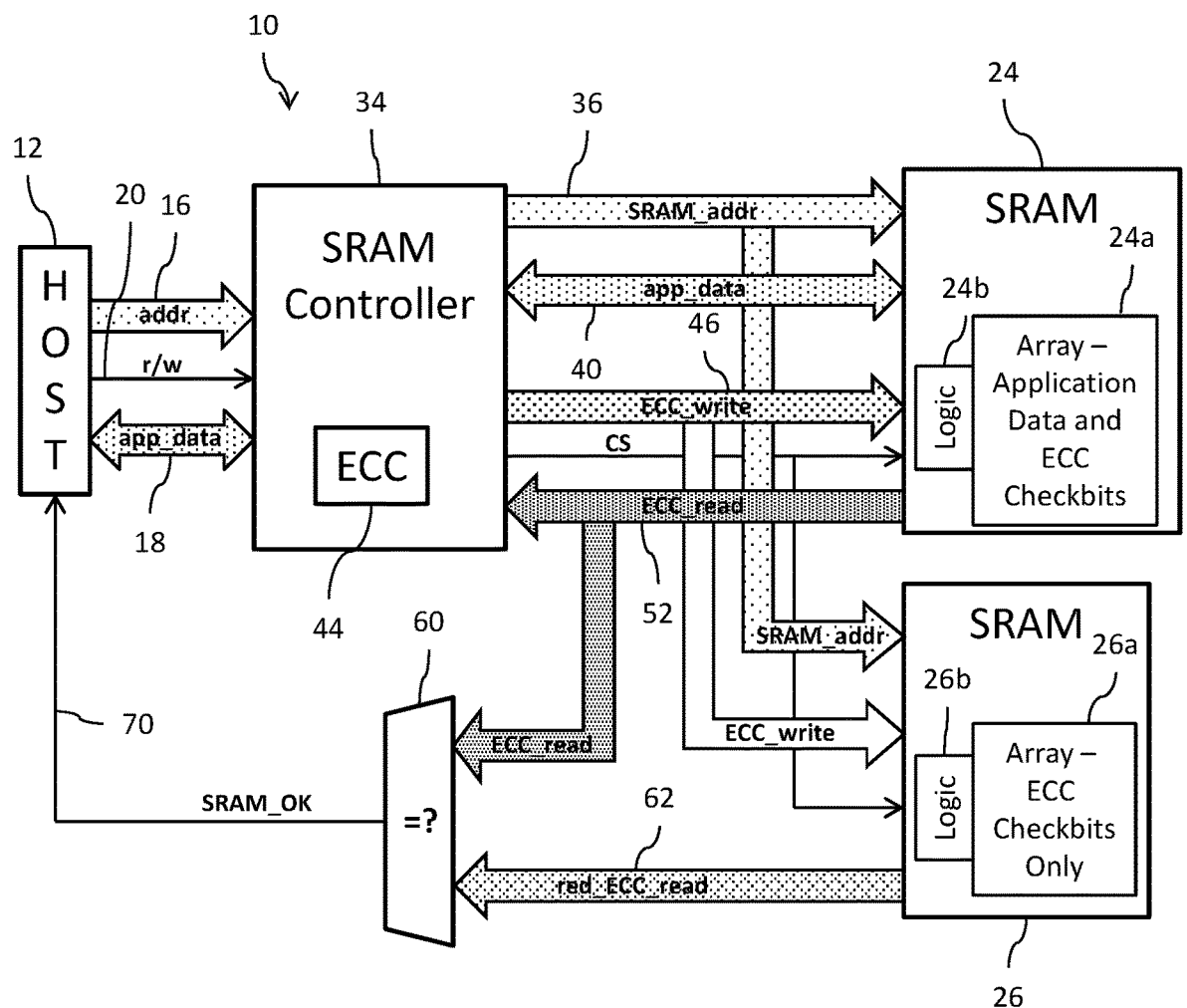

REDUNDANT STORAGE OF ERROR CORRECTION CODE (ECC) CHECKBITS FOR VALIDATING PROPER OPERATION OF A STATIC RANDOM ACCESS MEMORY (SRAM)

CROSS REFERENCE TO RELATED APPLICATION

This application is a continuation of U.S. application for patent Ser. No. 15/810,731, filed Nov. 13, 2017, the disclosure of which is incorporated by reference.

TECHNICAL FIELD

The present disclosure generally relates to a memory circuit or system for storing data and, in particular, to the validation of proper operation of a memory circuit by testing redundantly stored error correction code (ECC) checkbits.

BACKGROUND

Many systems include a memory circuit for storing application data. Proper operation of the system is dependent on the accuracy of the stored application data. It is known, however, that a memory circuit may store and/or retrieve application data that includes a bit error. For example, a bit error can be introduced in connection with the operation to write application data to a memory. A bit error can also be introduced in connection with the operation to read application data from a memory. It is also possible for a bit error to be introduced during the period of time while the application data is being stored by the memory. To address the concern with such bit errors in the application data, it is known in the art to apply an error correcting code (ECC), also referred to in the art as forward error correction (FEC), to the application data prior to storage. This coding process adds redundant data (for example, in the form of checkbits) to the application data, with both the application data and its associated redundant data being stored in the memory circuit. When later needed, both the application data and its associated redundant data are retrieved from the memory circuit, and the redundant data is used to detect the presence of an error in the retrieved application data as well as, in some instances, correct the detected error.

There is a limit, however, to the number and types of errors that can be corrected for a given ECC. Occurrence of bit errors in excess of that limit can lead to unpredictable results. This could be due to conditions of the operating environment or faults inside the memory circuit. Such unreliable behavior may not be acceptable in some applications. In addition, ECC may not be capable of detecting instances of a memory circuit malfunction.

A specific concern is with a malfunction of the logic circuitry of the memory circuit. Consider the following malfunction relating to addressing: application data with ECC is written to a first memory address within the memory circuit, but because of a malfunction of the logic circuitry within the memory circuit that application data is instead written to a second memory address. This malfunction raises three concerns. First, the data has been stored at the wrong address (i.e., the second memory address). Second, good data at that wrong address has been overwritten. Third, data that should have been overwritten is still present in the memory circuit at the correct address (i.e., the first memory address). Detection of this malfunction in memory operation is critical. However, the ECC does not provide sufficient protection because when a subsequent read from the first memory address is made, the read data versus the ECC will likely reveal no data errors. Similarly, a subsequent read from the second memory address will also likely reveal no data errors.

Consider also the following malfunction relating to chip select: application data is requested by a host for write to a certain selected memory chip, but because of a malfunction in the logic circuitry within the memory circuit for responding to the chip select (CS) signal, no write to the memory occurs. Thus, application data that should have been stored at an address in the memory circuit is not present, and data that should have been overwritten is still present in the memory circuit at that address. Again, detection of this malfunction is critical. However, the ECC does not provide sufficient protection because when a subsequent read from that memory address is made, the read data versus the ECC will likely reveal no data errors.

There is a need in the art to address the detection of malfunctions in memory circuit operation.

SUMMARY

In an embodiment, a memory system comprises: a first memory; a second memory; a memory controller circuit configured to: apply a memory address to both the first and second memories, write error correction code (ECC) checkbits to said memory address in both the first and second memories and read ECC check bits from only the first memory at said memory address; and a comparator circuit configured to: obtain ECC checkbits from said memory address in the first and second memories and perform a bit-by-bit comparison of the ECC checkbits received from both the first and second memories to generate a signal indicating that there is a malfunction of one or more of the first and second memories if the bit-by-bit comparison of the ECC checkbits fails.

In an embodiment, a system comprises: a host system configured to make a write request to write application data to memory; and a memory system operating responsive to said write request by: calculating error correction code (ECC) checkbits from the application data; writing the application data and the calculated ECC checkbits to a first memory; and writing the ECC checkbits, but not the application data, to a second memory.

In an embodiment, a memory system comprises: a first memory configured to store application data and error correction code (ECC) checkbits associated with that application data; a second memory configured to store said ECC checkbits associated with that application data, wherein the second memory does not store the application data; a memory controller circuit configured to read the application data and ECC checkbits from the first memory and detect and correct errors in the retrieved application data using the retrieved ECC checkbits; and a comparator circuit configured to receive ECC checkbits from both the first and second memories and perform a bit-by-bit comparison of the ECC checkbits received from both the first and second memories to generate a signal indicating that there is a malfunction of one or more of the first and second memories if the bit-by-bit comparison of the ECC checkbits fails.

In an embodiment, a system comprises: a host system configured to make a read request to read application data from memory; and a memory system operating responsive to said read request by: reading the application data and error correction code (ECC) checkbits associated with that application data from a first memory; detecting and correcting errors in the retrieved application data using the retrieved ECC checkbits; receiving the ECC checkbits associated with that application data from both the first memory and from a second memory that does not store the application data; and performing a bit-by-bit comparison of the received ECC checkbits to generate a signal indicating that there is a malfunction of one or more of the first and second memories if the bit-by-bit comparison of the ECC checkbits fails.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which:

FIG. 1 shows a block diagram of a memory system.

DETAILED DESCRIPTION

Reference is now made to FIG. 1 showing a block diagram of a memory system 10. The memory system 10 is coupled to a host system 12 (for example, in the form of a data processing system). The host system 12 has a need to store and retrieve application data. The memory system 10 operates in response to a host system 12 request to make that data storage and further operates in response to a host system request to retrieve the data from storage. The requests made by the host system 12, whether for data storing or data retrieving, include a memory address (addr) transmitted over an address bus 16 which specifies a location in the memory system 10 where the application data is to be stored or from which the application data is to be retrieved. A bidirectional data bus 18 couples the host system 12 to the memory system 10, with the data bus 18 carrying the application data (app_data). A read/write control line (r/w) 20 is used to specify whether the applied memory address (addr) is for a read operation or a write operation.

The memory system 10 includes a first memory 24 and a second memory 26. Each of the first and second memories 24 and 26 may, for example, comprise a static random access memory (SRAM) array. The first memory 24 includes a memory array 24a that is, however, substantially larger in size than the memory array 26a of the second memory 26. For example, first memory array 24a may have a size of n×(64+8) bits and the second memory array 26a may have a size of n×8 bits (where n represents the number of distinct addresses in the memory array). A logic circuit 24b (including circuits for address decoding, enable, multiplexing, etc.) provides an interface to the memory array 24a. A logic circuit 26b (including circuits for address decoding, enable, multiplexing, etc.) provides an interface to the memory array 26a.

Operation of the first and second memories 24 and 26 is controlled by a memory controller circuit 34. The memory controller circuit 34 is coupled to the first and second memories 24 and 26 by an address bus 36. In response to the memory address (addr) transmitted over the address bus 16 by the host system 12, the memory controller circuit 34 generates an address (SRAM_addr) specific to the first and second memories 24 and 26 for application to the address bus 36. In a preferred implementation, the same address (SRAM_addr) is applied to both the first memory 24 and the second memory 26 over the address bus 36, and thus the first and second memories 24 and 26 are configured to cover a same memory address range. The logic 24b and 26b processes the applied address to access locations with the memory arrays 24a and 26a, respectively.

The memory controller circuit 34 further asserts a chip select (CS) signal to select the first and second memories 24 and 26 for operation (read and or write). The CS signal is processed by the logic 24b and 26b to enable the memory arrays 24a and 26a, respectively, for operation.

The memory controller circuit 34 is further coupled to the first memory 24 by a bidirectional data bus 40, with the data bus 40 carrying the application data (app_data) to be stored in the first memory array 24a or to be retrieved from the first memory array 24a. The data bus 40 is not coupled to the second memory 26.

The memory controller circuit 34 includes an error correction code (ECC) circuit 44 that operates in a manner well known to those skilled in the art to process the application data (app_data received from the host system 12 during a requested write operation), as well as the memory address (addr) or address (SRAM_addr) in some cases, and calculate ECC checkbits (ECC_write) that are written to both the first and second memories 24 and 26 over a write ECC bus 46 at the memory location specified by the address (SRAM_addr) on the address bus 36. In an example implementation, 8 ECC checkbits may be calculated for each 64 bit piece of application data (app_data)

The memory controller circuit 34 is further coupled to the first memory 24 by a read ECC bus 52 which delivers ECC checkbits (ECC_read) that are read from the first memory 24 and delivered to the ECC circuit 44 in response to a read address on the address bus 36. In this context, it will be understood that the ECC checkbits (ECC_read) should be the same as the ECC checkbits (ECC_write), absent a malfunction of the first memory 24. In a manner well known to those skilled in the art, the ECC circuit 44 processes the ECC checkbits (ECC_read) to identify, and possibly correct, errors in the application data (app_data) read from the first memory 24.

Although FIG. 1 illustrates write ECC bus 46 and read ECC bus 52 as separate buses, it will be understood that in an implementation this is a logical distinction and that the ECC checkbits may instead be carried by a bidirectional bus.

A logic circuit 60 is coupled to the read ECC bus 52 and is further coupled to the second memory 26 by a redundant read ECC bus 62. The logic circuit 60 receives redundant ECC checkbits (red_ECC_read) that are accessed in the second memory 26 in response to the read address on the address bus 36. In this context, it will be understood that the redundant ECC checkbits (red_ECC_read) should be the same as the ECC checkbits (ECC_write), absent a malfunction of the second memory 26. The logic circuit 60 functions as a data comparator circuit to compare the individual bits of the ECC checkbits (ECC_read) to the individual bits of the redundant ECC checkbits (red_ECC_read). If all of the bits match in this bit-by-bit comparison, the logic circuit 60 asserts an SRAM_OK signal on line 70 coupled to the host system 12. The host system 12 understands that the assertion of the SRAM_OK signal on line 70 as an indication that there is no malfunction or failure of one or more of the first and second memories 24 and 26. Conversely, one or more bit mismatches in the bit-by-bit comparison indicates the presence of a malfunction of one or more or both of the first and second memories 24 and 26, and the SRAM_OK signal is thus deasserted by the logic circuit 60.

Operation of the memory system 10 during application data write is as follows: a) the host system 12 applies a memory address (addr) to the address bus 16, applies the application data (app_data) to the data bus 18 and asserts the write control signal; b) the memory controller circuit 34 generates an address (SRAM_addr) for both the first and second memories 24 and 26 from the memory address (addr) received from the host system 12 and applies the address (SRAM_addr) to the address bus 36; c) the memory controller circuit 34 further applies the application data (app_data) received from the host system 12 to the bidirectional data bus 40; d) the ECC circuit 44 processes the application data (app_data) received on the data bus 18 and calculates ECC checkbits (ECC_write); e) the memory controller circuit 34 further applies the ECC checkbits (ECC_write) to the write ECC bus 46; f) the logic circuit 24b of the first memory 24 stores the application data (app_data) and the ECC checkbits (ECC_write) at the specified address (SRAM_addr) in the memory array 24a; and g) the logic circuit 26b of the second memory 26 stores the ECC checkbits (ECC_write) at the specified address (SRAM_addr) in the memory array 26a (note: the second memory 26 does not store the application data (app_data)).

Operation of the memory system 10 during application data read is as follows: a) the host system 12 applies a memory address (addr) to the address bus 16 and asserts the read control signal; b) the memory controller circuit 34 generates an address (SRAM_addr) for both the first and second memories 24 and 26 from the memory address (addr) received from the host system 12 and applies the address (SRAM_addr) to the address bus 36; c) the logic circuit 24b of the first memory 24 retrieves the application data (app_data) and the ECC checkbits (ECC_read) stored at the address (SRAM_addr) in memory array 24a for application to the data bus 40 and the read ECC bus 52, respectively; d) the logic circuit 26b the second memory 26 retrieves the redundant ECC checkbits (red_ECC_read) stored at the address (SRAM_addr) in memory array 26a for application to the redundant read ECC bus 62; e) the ECC circuit 44 processes the application data (app_data) received on the data bus 40 and the ECC checkbits (ECC_read) received on the read ECC bus 52 to identify and correct errors, and applies to the error corrected application data (app_data) to the data bus 18 for delivery to the host system 12; and f) the logic circuit 60 performs a bit-by-bit comparison of the ECC checkbits (ECC_read) and redundant ECC checkbits (red_ECC_read), and asserts the SRAM_OK signal if there is a complete bit match (and otherwise deasserts the SRAM_OK signal if any bit mismatch is detected).

The host system 12 may process a deasserted SRAM_OK signal (indicating that the bit-by-bit comparison failed and possible memory malfunction) in any of a number of ways. For example, the host system 12 may raise a flag questioning memory operation but otherwise use the retrieved error corrected application data (app_data) as normal. Alternatively, the host system 12 may execute an operation to perform another read (at the same or different memory location) in response to deassertion of the SRAM_OK signal to double check for the detected malfunction. Still further, the host system 12 may terminate further memory access operations due to the detected malfunction and assert an error code.

Reference is now once again made to the previously noted concern with a malfunction of the logic circuitry of the memory. One malfunction of interest relates to an addressing malfunction where application data with ECC intended to be written to a first memory address within the memory, is instead written to a second memory address. With the implementation of FIG. 1, the incorrect write of application data with ECC to the second memory address may occur in the memory array 24a due to a malfunction of the logic 24b. However, it is unlikely that the logic 26b of the memory 26 is similarly affected, so the ECC would be correctly written to the first memory address in memory array 26a. With a subsequent read from the first memory address of the memory array 24a, the read data versus the ECC will likely reveal no data errors. However, the ECC_read from the first memory address in memory array 24a will not match the ECC read from the first memory address in memory array 26a. The deasserted SRAM_OK signal will accordingly indicate an error to the host 12. Along the same lines, with a subsequent read from the second memory address of the memory array 24a, the read data versus the ECC will likely reveal no data errors, but the ECC read from the second memory address in memory array 24a will not match the ECC read from the second memory address in memory array 26a. The deasserted SRAM_OK signal will accordingly indicate an error to the host 12.

With respect to the previously noted concern with a malfunction of the logic circuitry of the memory relating to chip select (CS), it will be recalled that application data requested by the host 12 for write to a certain selected memory chip does not occur. With the implementation of FIG. 1, even though the write of application data with ECC to a memory address in the memory 24 did not occur due to the logic 24b malfunction, it is unlikely that the logic 26b of the memory 26 is similarly affected. So, the ECC would be correctly written to that memory address in memory array 26a. With a subsequent read from that memory address of the memory array 24a, the read data versus the ECC will likely reveal no data errors. However, the ECC read from that memory address in memory array 24a will not match the ECC read from that memory address in memory array 26a. The deasserted SRAM_OK signal will accordingly indicate an error to the host 12.

An advantage of the implementation of FIG. 1 is that malfunctions in the logic of the memory can be detected using a small memory 26 with a relatively simple logic circuit. Prior art solutions to such memory logic malfunction detection/prevention would require a specially designed memory (such as with a feedbacked SRAM known in the art) or require a full duplication of the memory.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method of operating a memory system which includes a memory controller, a first memory and a second memory, the method comprising:
   when in a write mode of operation, the memory controller:
      applying a memory address to both the first memory and the second memory;
      writing application data with corresponding error correction code (ECC) checkbits to said memory address in the first memory; and writing the ECC checkbits, but not the corresponding application data, to said memory address in the second memory;

when in a read mode of operation, the memory controller:
applying the memory address to both the first memory and the second memory;
reading the ECC checkbits and corresponding application data from said memory address in only the first memory;
obtaining the ECC checkbits from said memory address in only the second memory; and
performing a bit-by-bit comparison of only the ECC checkbits read from the first memory and obtained from the second memory to generate a signal indicating that there is a malfunction of one or more of the first and second memories if the bit-by-bit comparison of the ECC checkbits fails.

2. The method of claim 1, further comprising performing by the memory controller of ECC processing on said application data received from a host system to generate the ECC checkbits.

3. The method of claim 1, further comprising performing by the memory controller of ECC processing on said application data and the ECC checkbits read from the first memory to detect and correct data errors in the read application data.

4. The method of claim 1, wherein the first and second memories each include an SRAM array.

5. The method of claim 1, wherein a memory array of the first memory array is larger than a memory array of the second memory.

6. A method, comprising:
writing application data by a memory controller of a memory system:
calculating error correction code (ECC) checkbits from the application data;
writing the application data and the calculated ECC checkbits to a first memory of said memory system; and
writing the ECC checkbits, but not the application data, to a second memory of said memory system.

7. The method of claim 6, wherein writing comprises the memory controller:
generating a memory address in response to a write request;
writing the application data and the calculated ECC checkbits to said memory address in the first memory of said memory system; and
writing the ECC checkbits, but not the application data, to the same memory address in the second memory of said memory system.

8. The method of claim 7, wherein each of the first and second memories includes an SRAM array.

9. The method of claim 7, wherein a memory array of the first memory is larger than a memory array of the second memory.

10. The method of claim 7, further comprising:
reading application data by the memory controller:
reading the application data and ECC checkbits from the first memory;
detecting and correcting errors in the read application data using the read ECC checkbits;
receiving the ECC checkbits from the first and second memories; and
performing a bit-by-bit comparison of only the received ECC checkbits from the first and second memories to generate a signal indicating that there is a malfunction of one or more of the first and second memories if the bit-by-bit comparison of the ECC checkbits fails.

11. The method of claim 10, wherein reading comprises the memory controller:
generating a memory address in response to a read request;
reading the application data and ECC checkbits from said memory address in the first memory; and
receiving the ECC checkbits from the same memory address in the first and second memories.

12. The method of claim 10, wherein each of the first and second memories includes an SRAM array.

13. The method of claim 10, wherein a memory array of the first memory is larger than a memory array of the second memory.

14. A method for memory controller operation, comprising:
storing application data and error correction code (ECC) checkbits associated with that application data in a first memory;
storing said ECC checkbits associated with that application data in a second memory, wherein the second memory does not store the application data;
reading the application data and ECC checkbits from the first memory;
detecting and correcting errors in the retrieved application data using the retrieved ECC checkbits;
receiving ECC checkbits from both the first and second memories; and
performing a bit-by-bit comparison of only the ECC checkbits received from both the first and second memories to generate a signal indicating that there is a malfunction of one or more of the first and second memories if the bit-by-bit comparison of the ECC checkbits fails.

15. The method of claim 14, further comprising applying a same memory address to both the first and second memories so as to read the application data and ECC checkbits from the first memory and cause the second memory to output said ECC checkbits.

16. The method of claim 14, wherein the first and second memories each include an SRAM array.

17. The method of claim 14, wherein a memory array of the first memory is larger than a memory array of the second memory.

18. A method for memory controller reading of application data, comprising:
reading the application data and error correction code (ECC) checkbits associated with that application data from a first memory of a memory system;
detecting and correcting errors in the retrieved application data using the retrieved ECC checkbits;
receiving the ECC checkbits associated with that application data from both the first memory and from a second memory of the memory system that does not store the application data; and
performing a bit-by-bit comparison of only the received ECC checkbits to generate a signal indicating that there is a malfunction of one or more of the first and second memories if the bit-by-bit comparison of the ECC checkbits fails.

19. The method of claim 18, wherein each of the first and second memories includes an SRAM array.

20. The method of claim 18, wherein a memory array of the first memory is larger than a memory array of the second memory.

21. The method of claim 18, further comprising:
generating a memory address for reading;
applying the memory address to the first memory when reading the application data and ECC checkbits from the first memory; and
applying the same memory address to the second memory when receiving the ECC checkbits.

* * * * *